(12) United States Patent
Oganesian

(10) Patent No.: US 9,018,725 B2
(45) Date of Patent: Apr. 28, 2015

(54) STEPPED PACKAGE FOR IMAGE SENSOR AND METHOD OF MAKING SAME

(75) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 300 days.

(21) Appl. No.: 13/225,092

(22) Filed: Sep. 2, 2011

(65) Prior Publication Data

US 2013/0056844 A1    Mar. 7, 2013

(51) Int. Cl.
*H01L 31/02* (2006.01)
*H01L 27/146* (2006.01)
*H01L 23/00* (2006.01)

(52) U.S. Cl.
CPC .... *H01L 27/14636* (2013.01); *H01L 27/14618* (2013.01); *H01L 2224/215* (2013.01); *H01L 2224/82106* (2013.01); *H01L 2224/2105* (2013.01); *H01L 2224/221* (2013.01); *H01L 2224/211* (2013.01); *H01L 24/13* (2013.01); *H01L 24/16* (2013.01); *H01L 24/19* (2013.01); *H01L 24/20* (2013.01); *H01L 24/29* (2013.01); *H01L 24/32* (2013.01); *H01L 24/73* (2013.01); *H01L 24/83* (2013.01); *H01L 24/92* (2013.01); *H01L 2224/1134* (2013.01); *H01L 2224/12105* (2013.01); *H01L 2224/13021* (2013.01); *H01L 2224/13022* (2013.01); *H01L 2224/131* (2013.01); *H01L 2224/13144* (2013.01); *H01L 2224/16227* (2013.01); *H01L 2224/16237* (2013.01); *H01L 2224/2919* (2013.01); *H01L 2224/32227* (2013.01); *H01L 2224/73217* (2013.01); *H01L 2224/81444* (2013.01); *H01L 2224/81447* (2013.01); *H01L 2224/83101* (2013.01); *H01L 2224/8385* (2013.01); *H01L 2224/92144* (2013.01); *H01L 2924/15156* (2013.01)

(58) Field of Classification Search
USPC .................................................. 257/98–99
See application file for complete search history.

(56) References Cited

U.S. PATENT DOCUMENTS

| 6,777,767 | B2 | 8/2004 | Badehi |
| 6,919,569 | B2 * | 7/2005 | Homme et al. .......... 250/370.11 |
| 6,972,480 | B2 | 12/2005 | Zilber et al. |
| 7,033,664 | B2 | 4/2006 | Zilber et al. |

(Continued)

FOREIGN PATENT DOCUMENTS

KR    10-0514917    9/2005

OTHER PUBLICATIONS

U.S. Appl. No. 13/157,193, filed Jun. 9, 2011, Oganesian, Vage.

(Continued)

*Primary Examiner* — Bradley K Smith
*Assistant Examiner* — David Goodwin
(74) *Attorney, Agent, or Firm* — DLA Piper LLP (US)

(57) ABSTRACT

An image sensor package includes a crystalline handler having opposing first and second surfaces, and a cavity formed into the first surface. At least one step extends from a sidewall of the cavity, wherein the cavity terminates in an aperture at the second surface. A cover is mounted to the second surface and extends over and covers the aperture. The cover is optically transparent to at least one range of light wavelengths. A sensor chip is disposed in the cavity and mounted to the at least one step. The sensor chip includes a substrate with front and back opposing surfaces, a plurality of photo detectors formed at the front surface, and a plurality of contact pads formed at the front surface which are electrically coupled to the photo detectors.

2 Claims, 11 Drawing Sheets

(56) References Cited

U.S. PATENT DOCUMENTS

| | | | |
|---|---|---|---|
| 7,157,742 B2 | 1/2007 | Badehi | |
| 7,192,796 B2 | 3/2007 | Zilber et al. | |
| 7,265,440 B2 | 9/2007 | Zilber et al. | |
| 7,274,094 B2 * | 9/2007 | Boon et al. | 257/680 |
| 7,495,341 B2 | 2/2009 | Zilber et al. | |
| 7,566,853 B2 * | 7/2009 | Tuckerman et al. | 250/208.1 |
| 7,642,629 B2 | 1/2010 | Zilber et al. | |
| 7,859,033 B2 | 12/2010 | Brady | |
| 7,893,514 B2 * | 2/2011 | Kwon et al. | 257/433 |
| 2004/0251525 A1 | 12/2004 | Zilber et al. | |
| 2005/0104179 A1 | 5/2005 | Zilber et al. | |
| 2005/0133808 A1 * | 6/2005 | Uraya et al. | 257/99 |
| 2005/0205977 A1 | 9/2005 | Zilber et al. | |
| 2007/0034777 A1 * | 2/2007 | Tuckerman et al. | 250/208.1 |
| 2007/0138498 A1 | 6/2007 | Zilber et al. | |
| 2007/0190691 A1 | 8/2007 | Humpston et al. | |
| 2007/0190747 A1 | 8/2007 | Humpston et al. | |
| 2008/0012115 A1 | 1/2008 | Zilber et al. | |
| 2008/0017879 A1 | 1/2008 | Zilber et al. | |
| 2008/0083976 A1 | 4/2008 | Haba et al. | |
| 2008/0083977 A1 | 4/2008 | Haba et al. | |
| 2008/0099900 A1 | 5/2008 | Oganesian et al. | |
| 2008/0099907 A1 | 5/2008 | Oganesian et al. | |
| 2008/0116544 A1 | 5/2008 | Grinman et al. | |
| 2008/0116545 A1 | 5/2008 | Grinman et al. | |
| 2008/0150121 A1 | 6/2008 | Oganesian et al. | |
| 2008/0246136 A1 | 10/2008 | Haba et al. | |
| 2009/0115047 A1 | 5/2009 | Haba et al. | |
| 2009/0160065 A1 | 6/2009 | Haba et al. | |
| 2009/0212381 A1 | 8/2009 | Crisp et al. | |
| 2010/0053407 A1 | 3/2010 | Crisp et al. | |
| 2010/0225006 A1 | 9/2010 | Haba et al. | |
| 2010/0230812 A1 | 9/2010 | Oganesian et al. | |
| 2010/0237452 A1 | 9/2010 | Hagiwara et al. | |
| 2011/0012259 A1 | 1/2011 | Grinman et al. | |
| 2011/0031629 A1 | 2/2011 | Haba et al. | |
| 2011/0033979 A1 | 2/2011 | Haba et al. | |
| 2011/0049696 A1 | 3/2011 | Haba et al. | |
| 2011/0187007 A1 | 8/2011 | Haba et al. | |
| 2012/0018863 A1 | 1/2012 | Oganesian et al. | |
| 2012/0018868 A1 | 1/2012 | Oganesian et al. | |
| 2012/0018893 A1 | 1/2012 | Oganesian et al. | |
| 2012/0018894 A1 | 1/2012 | Oganesian et al. | |
| 2012/0018895 A1 | 1/2012 | Oganesian et al. | |
| 2012/0020026 A1 | 1/2012 | Oganesian et al. | |
| 2012/0068327 A1 | 3/2012 | Oganesian et al. | |
| 2012/0068330 A1 | 3/2012 | Oganesian et al. | |
| 2012/0068351 A1 | 3/2012 | Oganesian et al. | |
| 2012/0068352 A1 | 3/2012 | Oganesian et al. | |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
U.S. Appl. No. 13/157,193, filed Jun. 2011, Oganesian.
Notice of Preliminary Rejection corresponding to the related Korean Patent Application No. 2012-0080093 mailed on Oct. 21, 2013.

* cited by examiner

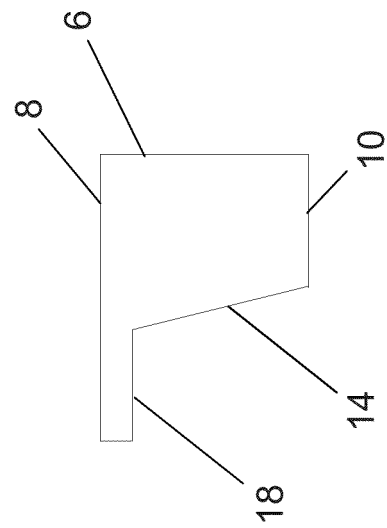
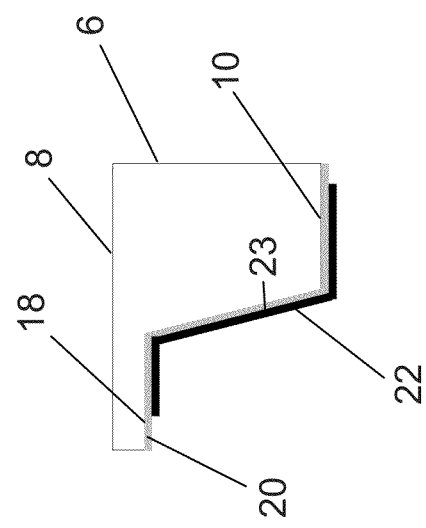
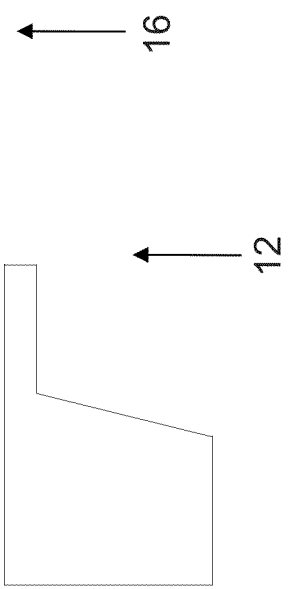
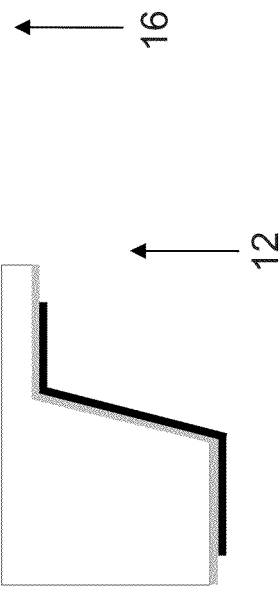

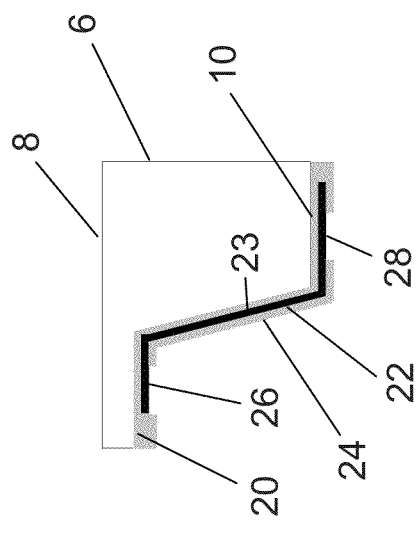
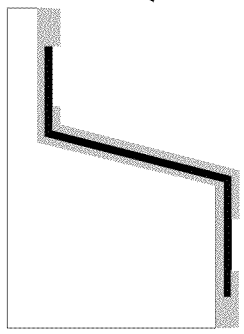
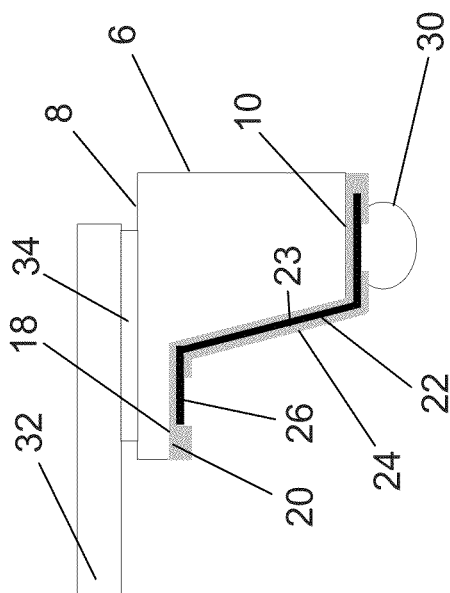

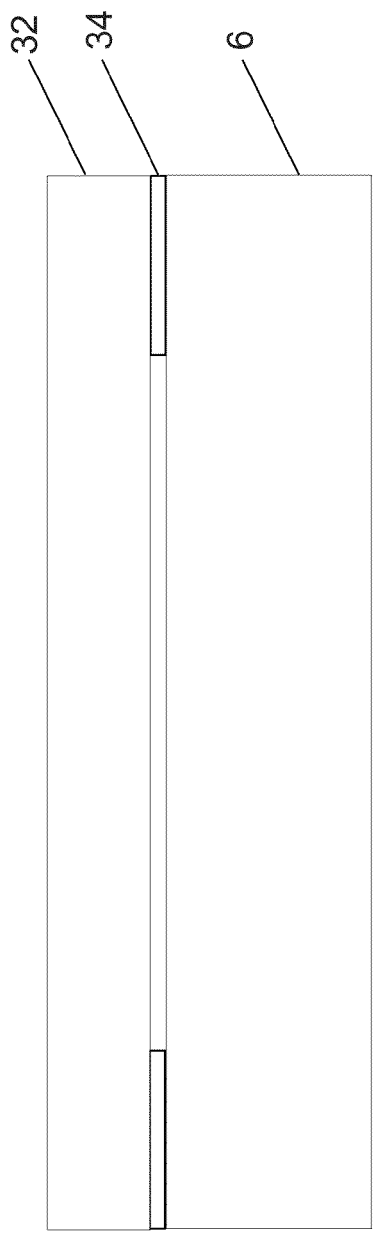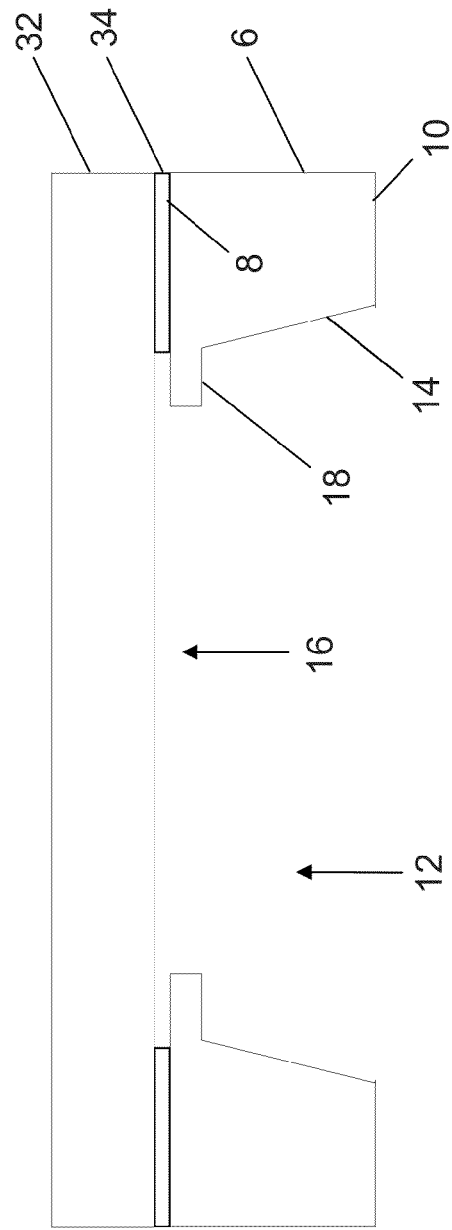

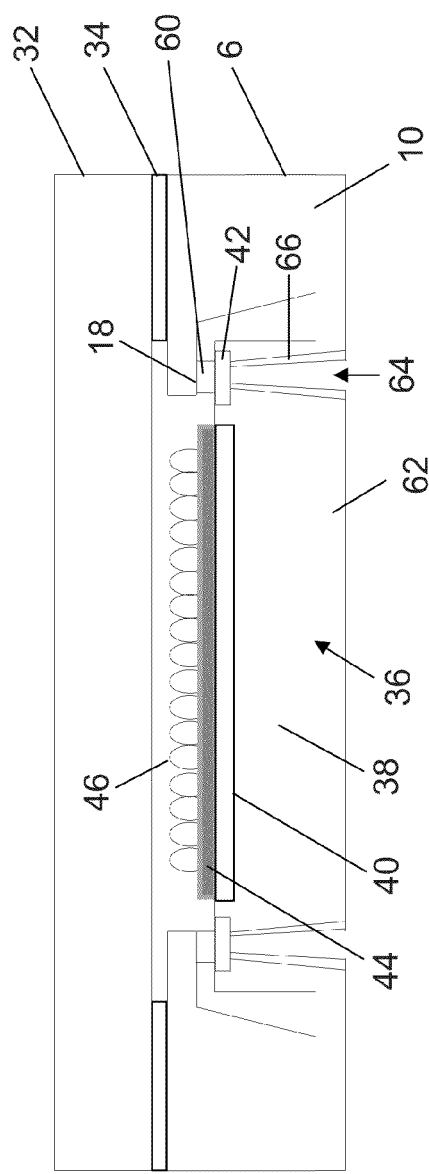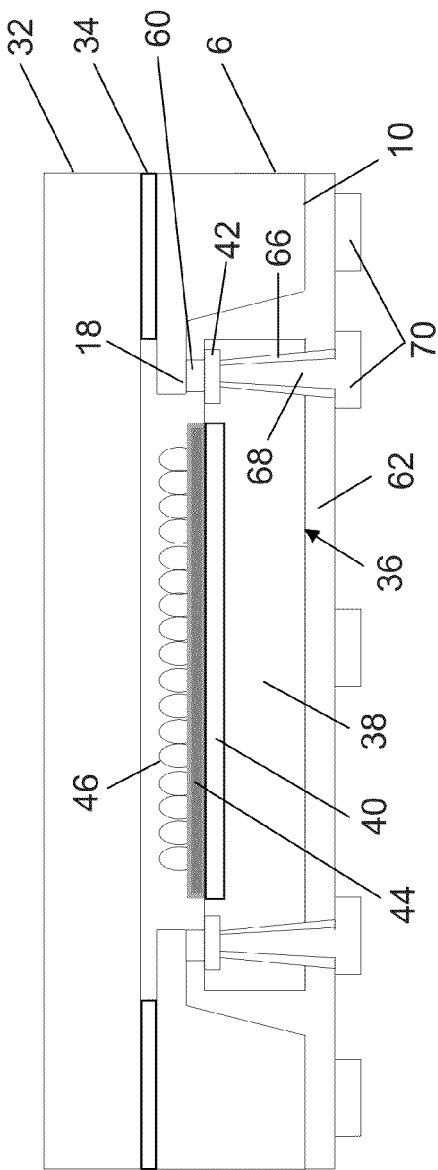

STEPPED PACKAGE FOR IMAGE SENSOR AND METHOD OF MAKING SAME

FIELD OF THE INVENTION

The present invention relates to packaging of microelectronic devices, and more particularly to a packaging of optical semiconductor devices.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution).

Presently, chip-on-board (COB—where the bare chip is mounted directly on a printed circuit board) and Shellcase Wafer Level CSP (where the wafer is laminated between two sheets of glass) are the dominant packaging and assembly processes used to build image sensor modules (e.g., for mobile device cameras, optical mice, etc.). However, as higher pixel image sensors are used, COB and Shellcase WLCSP assembly becomes increasingly difficult due to assembly limitations, size limitations (the demand is for lower profile devices), yield problems and the capital investment for packaging 8 and 12 inch image sensor wafers. For example, the Shellcase WLCSP technique involves packaging the image sensors on the wafer before the wafer is singulated into separate packaged chips, meaning that those chips from each wafer that are defective are still packaged before they can be tested (which drives up the cost).

There is a need for an improved package and packaging technique for chips such as image sensor chips that have already been singulated and tested, and provide a low profile packaging solution that is cost effective and reliable (i.e. provides the requisite mechanical support and electrical connectivity).

BRIEF SUMMARY OF THE INVENTION

One aspect of the present invention is an image sensor package that includes a crystalline handler having opposing first and second surfaces, the handler including a cavity formed into the first surface and at least one step extending from a sidewall of the cavity, wherein the cavity terminates in an aperture at the second surface, a cover mounted to the second surface and extending over and covering the aperture, wherein the cover is optically transparent to at least one range of light wavelengths, and a sensor chip disposed in the cavity and mounted to the at least one step. The sensor chip includes a substrate with front and back opposing surfaces, a plurality of photo detectors formed at the front surface, and a plurality of contact pads formed at the front surface which are electrically coupled to the photo detectors.

In another aspect of the present invention, an image sensor package includes a handler having opposing first and second surfaces and a sensor chip. The handler is optically transparent to at least one range of light wavelengths, includes a cavity formed into the first surface that does not reach the second surface, where the cavity includes at least one step extending from a sidewall of the cavity. The sensor chip is disposed in the cavity and is mounted to the at least one step. The sensor chip includes a substrate with front and back opposing surfaces, a plurality of photo detectors formed at the front surface, and a plurality of contact pads formed at the front surface which are electrically coupled to the photo detectors.

In yet another aspect of the present invention, a method of forming an image sensor package includes providing a crystalline handler having opposing first and second surfaces, forming a cavity into the first surface with at least one step extending from a sidewall of the cavity, wherein the cavity terminates in an aperture at the second surface, mounting a cover to the second surface which extends over and covers the aperture, wherein the cover is optically transparent to at least one range of light wavelengths, and mounting a sensor chip in the cavity and to the at least one step. The sensor chip includes a substrate with front and back opposing surfaces, a plurality of photo detectors formed at the front surface, and a plurality of contact pads formed at the front surface which are electrically coupled to the photo detectors.

In yet one more aspect of the present invention, a method of forming an image sensor package includes providing a handler having opposing first and second surfaces, forming a cavity into the first surface and not reaching the second surface, wherein the cavity includes at least one step extending from a sidewall of the cavity, and wherein the handler is optically transparent to at least one range of light wavelengths, and mounting a sensor chip in the cavity and to the at least one step. The sensor chip includes a substrate with front and back opposing surfaces, a plurality of photo detectors formed at the front surface, and a plurality of contact pads formed at the front surface which are electrically coupled to the photo detectors.

Other objects and features of the present invention will become apparent by a review of the specification, claims and appended figures.

BRIEF DESCRIPTION OF THE DRAWINGS

FIGS. 1A-1E. are cross sectional side views of a semiconductor packaging structure showing in sequence the steps in the processing of the packaging structure for an image sensor chip.

FIGS. 2A-2G are cross sectional side views of an alternate embodiment of the semiconductor packaging structure showing in sequence the steps in the processing of the packaging structure for an image sensor chip.

DETAILED DESCRIPTION OF THE INVENTION

Figure 1E:
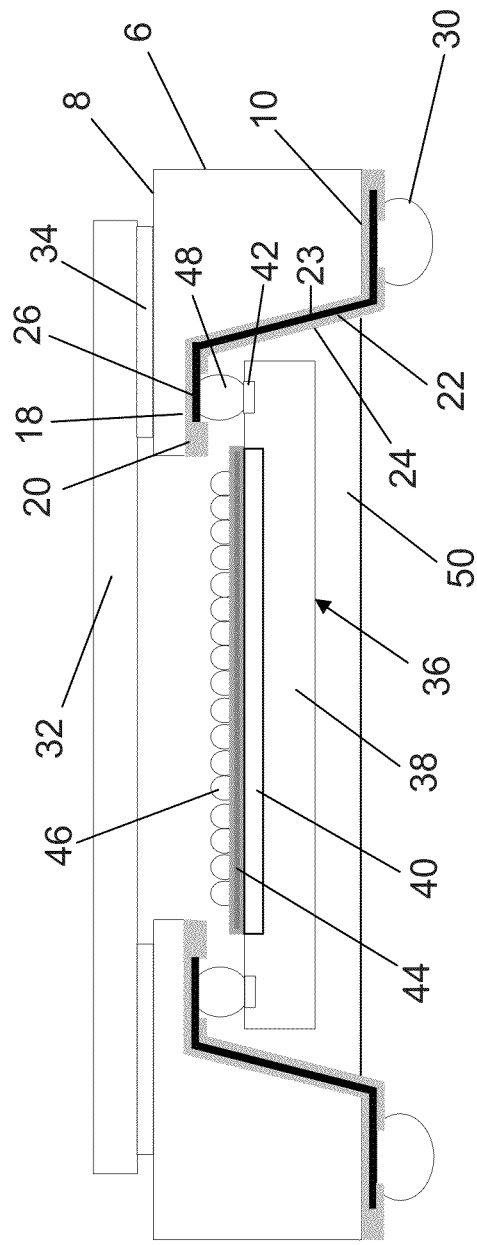

The present invention is a wafer level, low stress package solution that is ideal for image sensors. The formation of the low stress package solution is described below.

The formation process begins with a crystalline handler 6, which includes top and bottom surfaces 8 and 10 respectively. A cavity 12 is formed into the bottom surface 10 of the handler 6, as shown in FIG. 1A. Cavity 12 can be formed by the use of a laser, a plasma etching process, a sandblasting process, a mechanical milting process, or any other similar method. Preferably cavity 12 is formed by photo-lithography plasma etching, which includes forming a layer of photo resist on the handler 6, patterning the photo resist layer to expose a select portion of handler 6, and then performing a plasma etch process (e.g., using a SF6 plasma) to remove the exposed portion of the handler 6 to form the cavity 12. Preferably, the cavity 12 extends no further than ¾ of the crystalline substrate thickness, or at least leaves a minimum thickness at the maximum depth portion of the cavity of around 50 μm, The plasma etch can be anisotropic, tapered, isotropic, or combinations thereof. As shown, the plasma etch is tapered, where the cavity sidewalk 14 have an angle of around 5 degrees away from vertical (i.e. the side-walls 14 extend inwardly with depth). An aperture 16 is then formed through the thinned portion of the crystalline handler 6 (from cavity 12 through top surface 8), by any of the techniques listed above for forming cavity 12. The lateral dimensions (i.e. diameter) of aperture 16 are smaller than those of cavity 12, resulting in a stepped sidewall 14 (i.e. with step 18 extending out toward the center of aperture 16, where step 18 includes a substantially laterally extending surface terminating at a substantially vertically extending surface). Preferably, step 18 is continuous around the circumference of cavity 12 (i.e. step 18 is in the form of an annular shoulder that defines aperture 16). However, a plurality of discrete steps 18 could be formed that extend inwardly toward the center of aperture 16 at discrete positions. To ensure proper imaging through aperture 16, the dimensions of aperture 16 are preferably slightly larger (e.g. at least 50 μm) than the imaging area of the sensor chip (described below). The resulting structure is shown in FIG. 1A.

An isolation (dielectric) layer 20 is next formed on the bottom surface 10 and cavity sidewall 14 and step 18. Layer 20 can be Si oxide, Si nitride, epoxy based, polyimide, resin, FR4, or any other appropriate dielectric material, Preferably, layer 20 is at least 0.1 μm in thickness, and is formed using any conventional dielectric layer deposition technique (which are well known in the art). A conductive layer 22 is then formed on layer 20. Conductive layer 22 can be Cu, Cu/Ni/Au, Cu/Au, Ti/Cu/Au, AL/Ni/Cu, or another other well known conductive material(s). A photolithography step is next performed to remove those portions of layer 22 immediately adjacent the outer edge of bottom surface 10, the inner edge of step 18 (adjacent aperture 16), and selective portions of the above to form a plurality of discrete traces 23 each extending from step 18 to bottom surface 10. The resulting structure is shown in FIG. 1B.

A dielectric layer 24 is formed over conductive layer 22 (and the exposed portions of isolation layer 20). Layer 24 can be Si oxide, Si nitride, epoxy based, polyimide, resin, FR4, or any other appropriate dielectric material. Preferably, layer 24 is at least 0.1 μm in thickness, and is formed using any appropriate dielectric layer deposition technique (which are well known in the art), such as electrochemical deposition, lamination, spray or spin coating, etc. A photolithography step is next performed to remove selective portions of layer 24 on step 18 and on bottom surface 10 to expose selective portions of conductive layer 22 (i.e. the end portions of each trace 23). The selectively exposed portions of conductive layer 22 form contact pads 26/28 respectively. The resulting structure is shown in FIG. 1C.

SMT (surface mount) interconnects 30 are next formed on contact pads 28. SMT interconnects can be BGA type, and formed using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto contact pads. Alternately SMT interconnects can be conductive metal posts (e.g. copper). A cover 32 is affixed to the top surface 8 of handler 6, preferably with an adhesive 34. Cover 32 extends across and preferably seals aperture 16, and is optically transparent to at least one range of light wavelengths (e.g. visible light for camera applications). In a preferred embodiment, cover 32 is made of glass or polymer, having a thickness of at least 25 μm, The cover 32 can include anti-reflective and/or infrared coatings. The resulting structure is shown in FIG. 1D.

A sensor chip 36 is inserted into cavity 12 and mounted to step(s) 18. The sensor chip 36 includes a substrate 38 on which a plurality of photo detectors 40 (and supporting circuitry) are formed, along with contact pads 42. The photo detectors 40 (and supporting circuitry) and contact pads 42 are formed at the upwardly facing (front) surface of substrate 38 as shown in FIG. 1E. The contact pads 42 are electrically connected to the photo detectors 40 (and/or their supporting circuitry) for providing off chip signaling. Each photo detector 40 converts light energy to a voltage signal. Additional circuitry on the chip may be included to amplify the voltage, and/or convert it to digital data. Color filters 44 and microlenses 46 are mounted over the photo detectors 40. Image sensors of this type are well known in the art, and not further described herein. The sensor chip 36 is mechanically and electrically connected to the handler 6 via flip chip connectors 48, which electrically connect each contact pad 42 (on sensor chip 36) with one of the contact pads 26 (on step 18). Examples of connectors 48 include BGA, Au stud bumps, and conductive paste. An optional encapsulate (dielectric) material can be used to fill cavity 12, and thereby encapsulate sensor chip 36 therein. The resulting structure is shown in FIG. 1E.

The packaged sensor chip assembly of FIG. 1E provides many advantages. First, providing a crystalline handler 6 with a stepped cavity (i.e. a laterally extending step 18 to which the sensor chip 36 is mounted) provides superior mechanical and electrical stability, and a reliable technique for mounting and electrically connecting the sensor chip 36 to the handler 6. Second, off-chip connectivity is reliably provided by conductive layer 22 formed on handler 6. Third, by providing a packaging structure separate from the finished sensor chip 36, sensor chips 36 can be fully tested before installation, thereby saving the costs of packaging sensor chips that turn out to be defective. Fourth, forming the walls of cavity 12 with a slant reduces potentially damaging inducing stress on the crystalline handler that can result from 90 degree corners. Fifth, the slanted sidewalls of cavity 12 also mean there are no negative angle areas that can result in gaps in the layers of materials formed thereon. Sixth, by forming isolation layer 20 first, and then forming metallization layer 22 thereon, metal diffusion into the crystalline handler 6 is avoided. Seventh, by sealing aperture 16 with cover 32, microlenses 46 are protected from contamination while allowing light to pass through cover 32 and reach sensor chip 36. Seventh, sensor chip 36 can be encapsulated within handler 6 for better device protection and reliability. Eighth, the package structure can be used for side by side integration of multiple components such as the integration of back side illuminated image sensors with supporting processors and memory chips within one SMT compatible package without increasing the total height of the package.

Figure 2C:
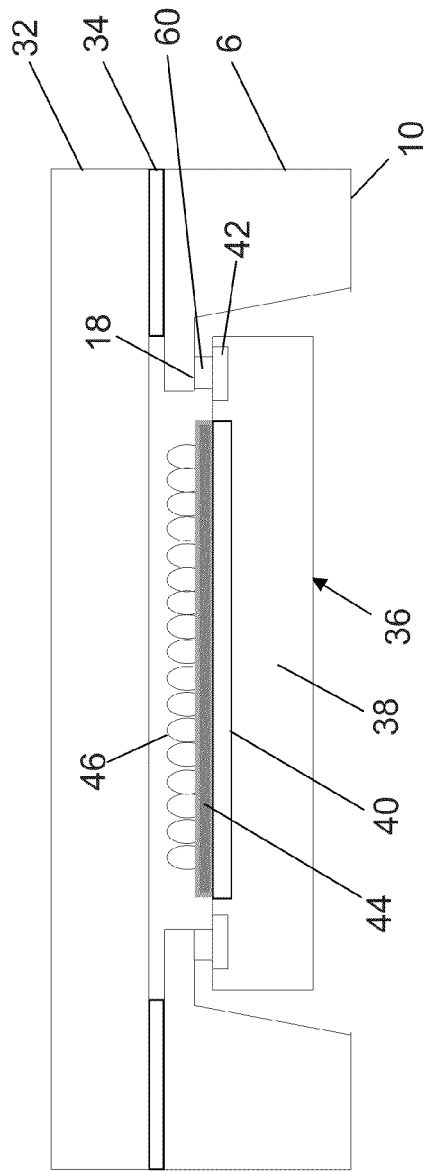

FIGS. 2A-2G illustrate the formation of a first alternate embodiment, in which the cover 32 is mounted to the crystalline handler 6 (as illustrated in FIG. 2A) before the handler 6 is processed to form cavity 12, aperture 16, and step(s) 18

(using the same processing steps as described above with respect to FIG. 1A). The resulting structure is illustrated in FIG. 2B.

Figure 2D:
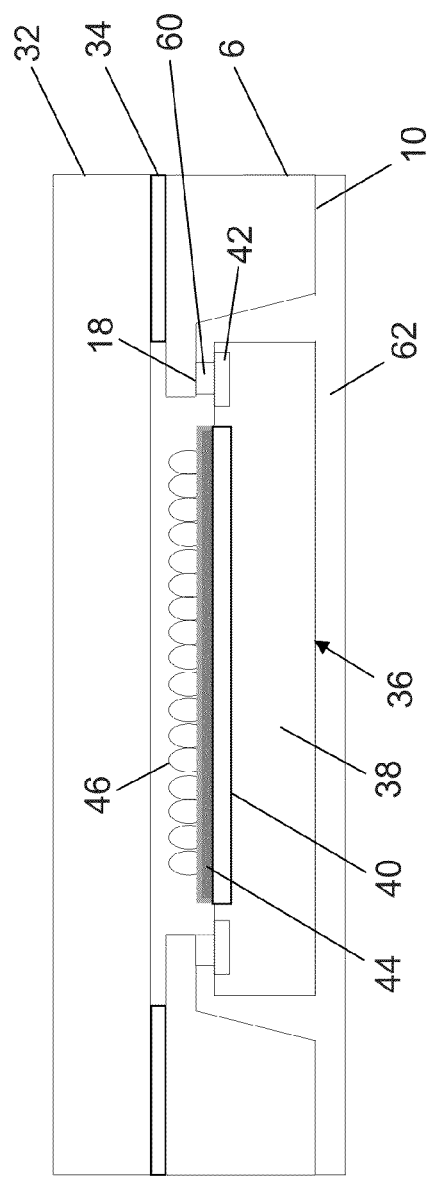

The sensor chip 36 is then inserted into cavity 12, and mounted to step(s) 18 via a dielectric mounting material 60 (e.g. epoxy, tape, etc.), as illustrated in FIG. 2C. At this point, the height of the handler 6 can be reduced by a silicon etch, which removes the bottom portion of handler 6 so that its bottom surface 10 is even with the sensor chip's back surface. A dielectric material 62 is then formed over bottom surface 10 and in cavity 12, which encapsulates sensor chip 36 in cavity 12. The resulting structure is illustrated in FIG. 2D, Holes 64 are then formed through the dielectric material 62 and into the sensor chip substrate 38 to expose contact pads 42. Holes 64 can be formed by using a $CO_2$ laser (e.g. spot size of about 70 μm) for larger sized holes 64, or a UV laser (e.g. spot size of about 20 μm at a wavelength of 355 nm) for smaller sized holes 64 (e.g. less than 50 μm in diameter). Laser pulse frequencies between 10 and 50 kHz at a pulse length of less than 140 ns can be used. The profile of holes 64 may be tapered, with a larger dimension at the surface through which holes 64 are formed. Preferably the minimum and maximum hole diameters are around 5 to 250 μm respectively, and the angles of the walls are between 0° and 45° relative to a direction perpendicular to the surface through which the holes 64 are formed (i.e. such that the holes 64 have smaller cross-sectional sizes at the contact pads 42). An insulation layer 66 is formed on the sidewalls of holes 64 by thin film coating (e.g. spray, spin and/or electrochemical deposition) and photolithography processes. The resulting structure is shown in FIG. 2E.

A conductive material layer 68 is next deposited over dielectric material layer 62, which also fills holes 64 with the conductive material. Conductive material layer 68 is preferably a metal material, such as copper, tungsten, aluminum, aluminum copper alloy, etc. A photo-lithography process is next performed to selectively remove portions of conductive layer 68, leaving fan-in/fan-out interconnects 70 that are each electrically connected to one of the contact pads 42. The resulting structure is shown in FIG. 2F.

A layer of dielectric (insulation) material 72 is formed over layer 62 and interconnects 70. A photo-lithography process is next performed to selectively remove those portions of dielectric layer 72 over interconnects 70, thus exposing interconnects 70. The SMT interconnects 30 are next formed on interconnects 70, preferably in the form of BGA type interconnects, The resulting structure is shown in FIG. 2G.

Figure 2G:
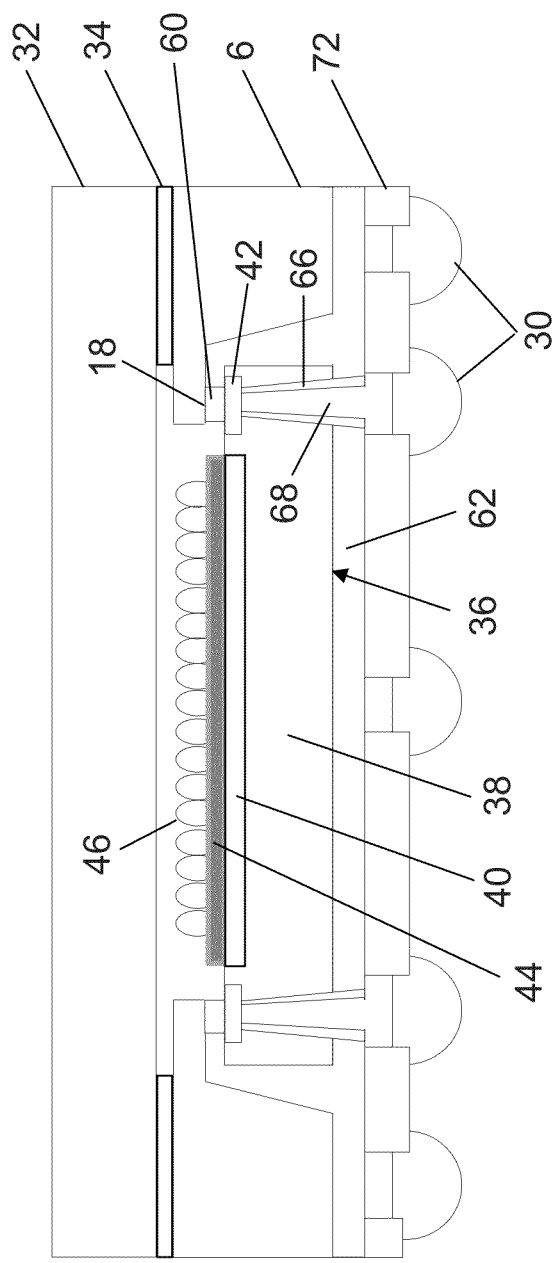

With the embodiment of FIG. 2G, off-chip conductivity is routed from the sensor chip contact pads 42, through the sensor chip substrate 38 via conductive material 67, and to SMT interconnects 30. In addition to the advantages listed above, the structure enables higher levels of routing and shorter interconnects, which will help improve electrical performance and reduce power consumption.

Figure 3:
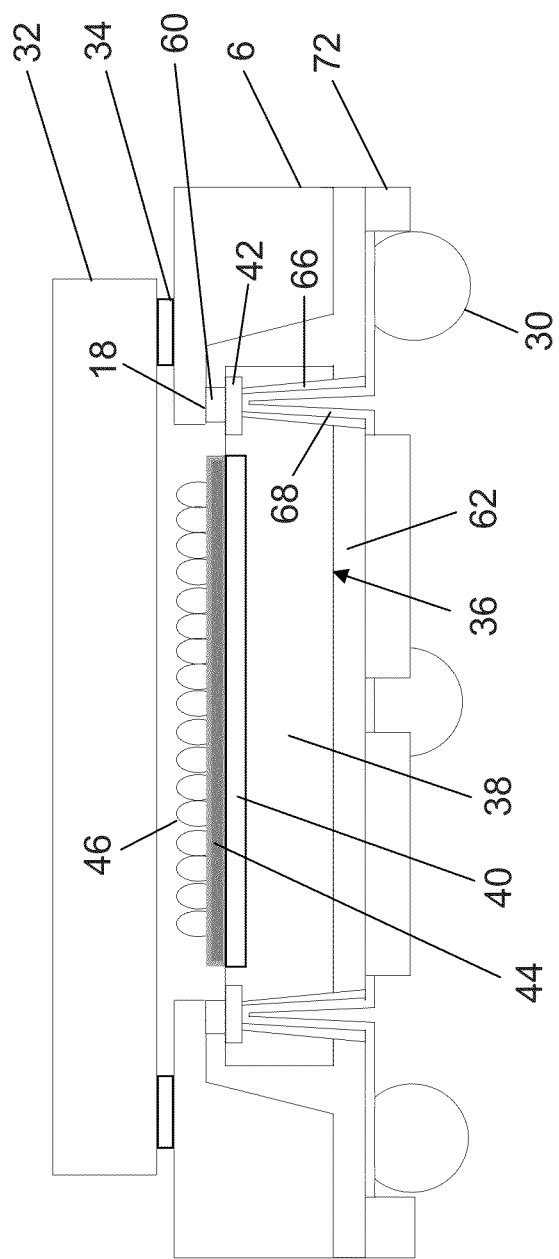
FIG. 3 is a cross sectional side view of the embodiment of FIG. 2G, but with modified configurations for the conductive material in the semiconductor holes, the cover and the interconnects.

With respect to the embodiment of FIG. 2G, it should be noted that in forming conductive layer 68, it need not fill holes 64, but rather could form a conductive layer along the sidewalls of holes 64, as illustrated in FIG. 3. Also illustrated in FIG. 3 are interconnects 30 that are not aligned to holes 64 (i.e. shown as fan-out interconnects), and cover 32 having a smaller lateral dimension than handler 6.

Figure 4:
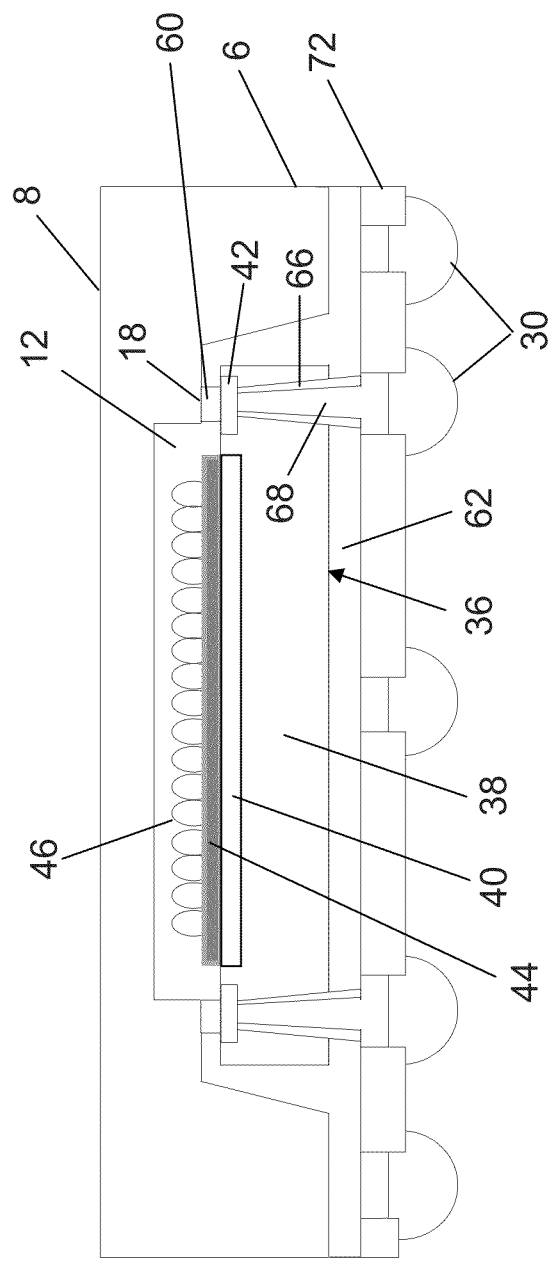
FIG. 4 is a cross sectional side view of a second alternate embodiment of the semiconductor packaging structure.

FIG. 4 illustrates a second alternate embodiment in which cover 32 is integrally formed as part of an optically transparent handler 6. Instead of forming aperture 16 that extends from cavity 12 to top surface 8 of handler 6, cavity 12 is extended beyond step 18 far enough to accommodate color filters 44 and microlenses 46. In this embodiment, the handler 6 is preferably made of an amorphous (non-crystalline) glass. The monolithic (single material) structure of handler 6 enables a higher level of hermeticity-controlled operating environment by protecting the sensor chip 36 from moisture and undesirable organic materials. Moisture penetration is a common failure mode for packages immersed in liquid or high-humidity environments. Moisture inside a package can cause condensation on the active area of the device, leading to corrosion of the structure and/or degraded performance. In addition, the structure also eliminates the need for hermetically sealed cavities, and thus has a higher tolerance and reliability than structures utilizing high temperature anodic, fusion, solder, etc. bonding processes.

Figure 5:
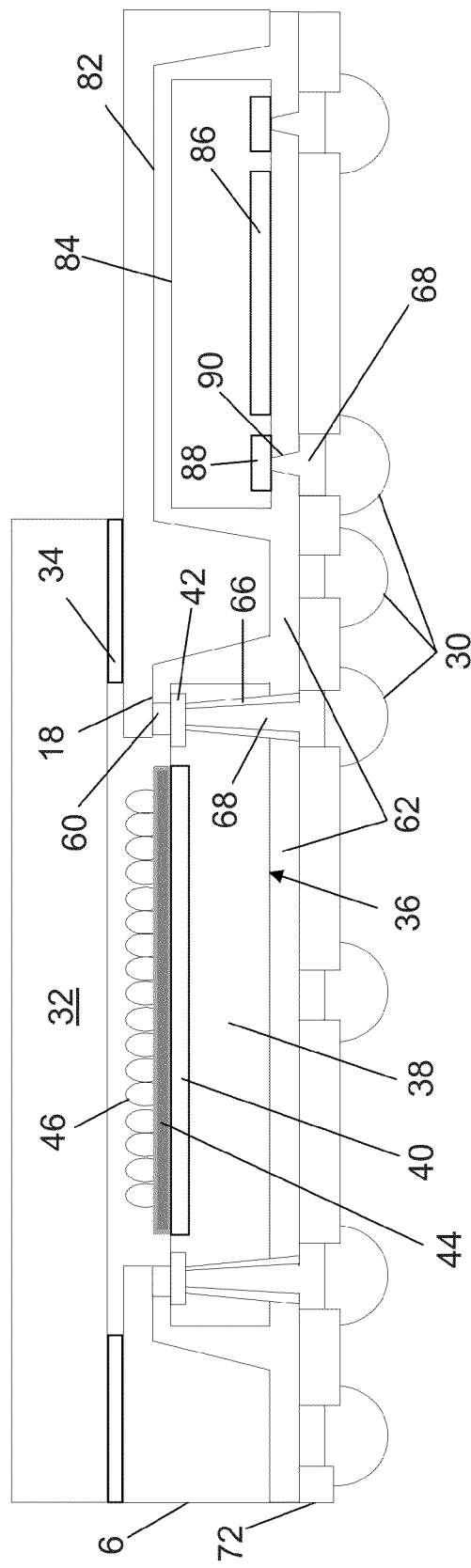
FIG. 5 is a cross sectional side view of a third alternate embodiment of the semiconductor packaging structure.

FIG. 5 illustrates a third alternate embodiment which includes an integrated processor for the sensor chip 36. A second cavity 82 is formed in the handler 6 laterally adjacent cavity 12 (in the same manner that was used to form cavity 12). A second chip (e.g. a processor IC chip) 84 is then inserted into second cavity 82. The IC chip 84 includes a processor integrated circuit 86 for processing the signals from the sensor chip 36. The IC chip 82 includes conductive contact pads 88 exposed on its front surface for communicating signals on and off chip. The IC chip 84 is encapsulated in second cavity 82 by dielectric material 62. Holes 90 that expose contact pads 88 can be formed through dielectric material 62 in the same manner as holes 64. Holes 90 can be filled with conductive material 68, and SMT interconnects 30 formed thereon, as described above and illustrated in FIG. 5.

The advantage of the embodiment of FIG. 5 is that it provides co-packaging for sensor chip 36 and processor chip 84. The processing chip 84 comprises a combination of hardware processor(s) and software algorithms that together constitute an image processor for gathering the luminance and chrominance information from the individual photo detectors 40 and using it to compute/interpolate the correct color and brightness values for each pixel. The image processor evaluates the color and brightness data of a given pixel, compares them with the data from neighboring pixels and then uses a demosaicing algorithm to reconstruct a full color image from the incomplete color samples, and produces an appropriate brightness value for the pixel. The image processor also assesses the whole picture and corrects sharpness and reduce noise of the image.

The evolution of image sensors results in the ever higher pixel count in image sensors, and the additional camera functionality, such as auto focus, zoom, red eye elimination, face tracking, etc, which requires more powerful image sensor processors that can operate in higher speeds. Photographers don't want to wait for the camera's image processor to complete its job before they can carry on shooting—they don't even want to notice some processing is going on inside the camera. Therefore, image processors must be optimized to cope with more data in the same or even shorter period of time.

Figure 6:
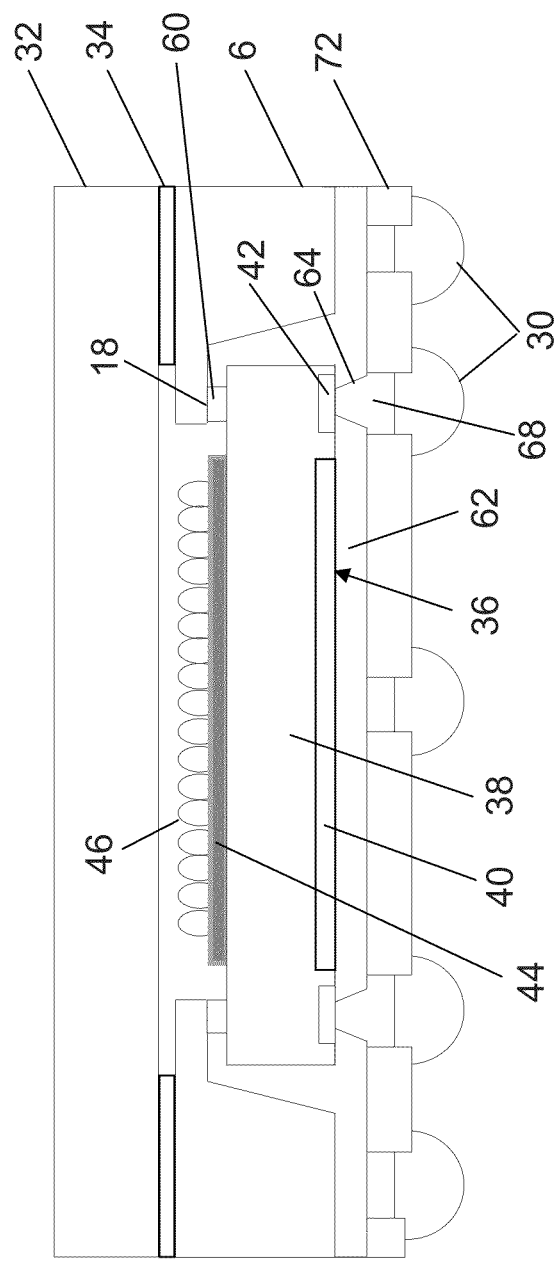
FIG. 6 is a cross sectional side view of the embodiment of FIG. 2G, but with a BSI type sensor.

The sensor chip 36 described above and illustrated in FIGS. 1-5 is a front side illuminated (FSI) type sensor, in which the photo detectors 40, supporting circuitry and contact pads 42, color filters and microlenses are formed on the chip's front surface, and the photo detectors 40 are oriented to capture/measure light impinging the front surface of the chip. However, back side illuminated (BSI) type sensors are also known, where the photo detectors are configured to capture/measure light entering through the back surface of the chip, whereby the light passes through the silicon substrate and to the photo-detectors. The color filters 44 and microlenses 46 are mounted to the back surface of the chip. The advantage of BSI sensors is that, given the circuitry layers are usually nearer the front surface of the chip than the photo detectors, the circuitry is avoided when light enters from the back surface. The packaging techniques described above can be implemented using BSI type sensor chips, as illustrated in FIG. 6, where the back surface (instead of the front surface) is mounted to the step(s) 18, and holes 64 only extend through dielectric material 62 to expose contact pads 42 (no need for holes to extend into the substrate).

It is to be understood that the present invention is not limited to the embodiment(s) described above and illustrated herein, but encompasses any and all variations falling within the scope of the appended claims. For example, references to the present invention herein are not intended to limit the scope of an claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the image sensor packaging of the present invention. Single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An image sensor package, comprising:
    a crystalline handler having opposing first and second surfaces, the handler including a cavity formed into the first surface and at least one step extending from a sidewall of the cavity, wherein the cavity terminates in an aperture at the second surface;
    a cover mounted to the second surface and extending over and covering the aperture, wherein the cover is optically transparent to at least one range of light wavelengths;
    a sensor chip disposed in the cavity, wherein the sensor chip includes:
        a substrate with front and back opposing surfaces,
        a plurality of photo detectors formed at the front surface, and
        a plurality of contact pads formed at the front surface which are electrically coupled to the photo detectors,
        wherein the front surface of the sensor chip is mounted to the at least one step;
    a plurality of electrically conductive traces each formed on and insulated from a surface of the at least one step, a surface of the sidewall of the cavity, and the first surface; and
    a plurality of electrical connectors disposed between the substrate front surface and the at least one step, wherein each of the electrical connectors is electrically connected between one of the traces and one of the contact pads.

2. The image sensor package of claim 1, further comprising:
    dielectric material disposed in the cavity and encapsulating the sensor chip in the cavity.

* * * * *